(12) United States Patent
Yamashita

(10) Patent No.: US 7,707,965 B2
(45) Date of Patent: May 4, 2010

(54) PROCESSING APPARATUS AND LID OPENING/CLOSING MECHANISM

(75) Inventor: Jun Yamashita, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 391 days.

(21) Appl. No.: 11/684,717

(22) Filed: Mar. 12, 2007

(65) Prior Publication Data
US 2007/0238307 A1 Oct. 11, 2007

(30) Foreign Application Priority Data
Mar. 13, 2006 (JP) ............................. 2006-067733

(51) Int. Cl.
C23C 16/00 (2006.01)
C23F 1/00 (2006.01)
H01L 21/306 (2006.01)

(52) U.S. Cl. ..................... 118/723 MW; 118/719; 118/733; 156/345.31; 156/345.32

(58) Field of Classification Search ............ 156/345.31, 156/345.32; 118/719, 733
See application file for complete search history.

(56) References Cited

U.S. PATENT DOCUMENTS

| 5,695,564 | A | * | 12/1997 | Imahashi | 118/719 |
| 6,009,667 | A | * | 1/2000 | Mizukami | 49/153 |
| 6,558,506 | B1 | * | 5/2003 | Freeman et al. | 156/345.32 |
| 2004/0011465 | A1 | * | 1/2004 | Matsumoto et al. | 156/345.41 |

FOREIGN PATENT DOCUMENTS

JP 11-101345 4/1999

* cited by examiner

Primary Examiner—Parviz Hassanzadeh
Assistant Examiner—Rakesh Dhingra
(74) Attorney, Agent, or Firm—Oblon, Spivak, McClelland, Maier & Neustadt, L.L.P.

(57) ABSTRACT

A processing apparatus includes an openable/closable lid disposed on a process container, and an opening/closing mechanism configured to open/close the lid. The opening/closing mechanism includes a hinge structure swingably coupling the lid to one end of the process container, and a drive structure configured to swing the lid. The hinge structure includes a main shaft used as a rotation axis when the lid is swung by the drive structure, and an adjusting shaft located on a distal end side relative to the main shaft, for adjusting an angle of the lid.

16 Claims, 8 Drawing Sheets

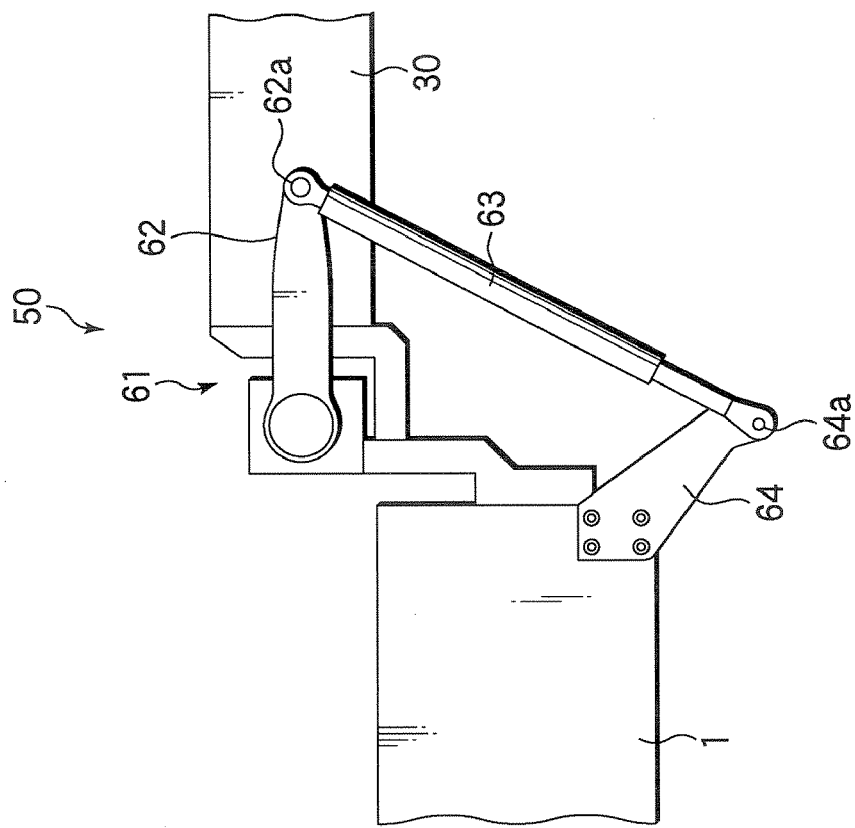
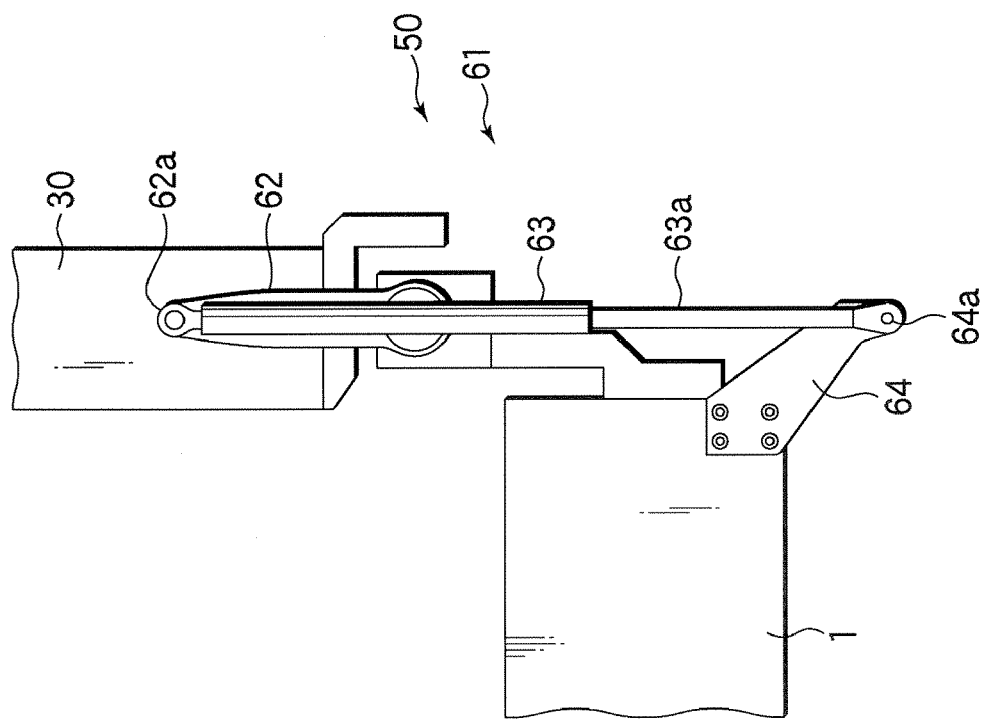

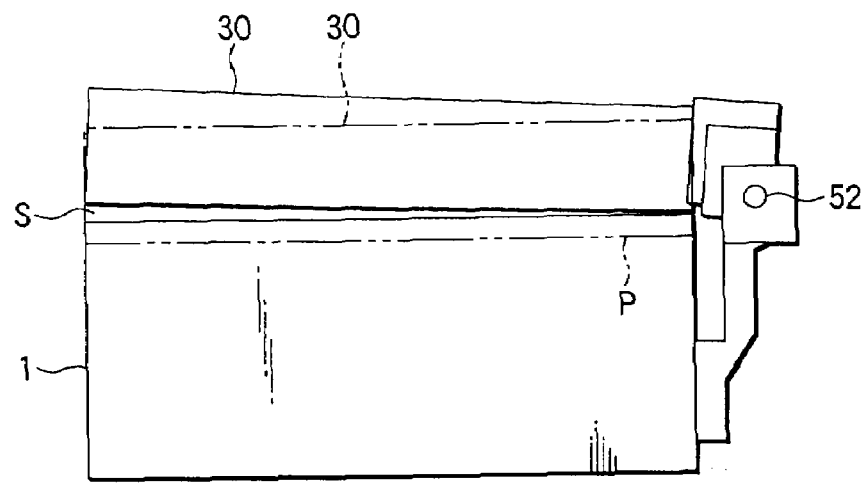
BACKGROUND ART  FIG.9
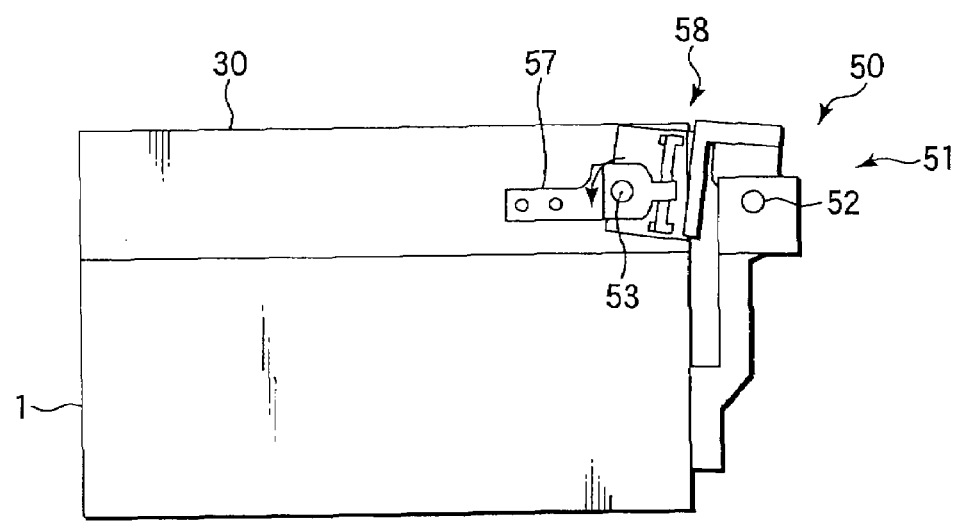
FIG.10

PROCESSING APPARATUS AND LID OPENING/CLOSING MECHANISM

BACKGROUND OF THE INVENTION

1. Field of the Invention

The present invention relates to a processing apparatus for performing a process, such as a plasma process, on a target object, such as a semiconductor wafer, and a lid opening/closing mechanism used for the apparatus.

2. Description of the Related Art

Conventionally, for example, in the process of manufacturing semiconductor devices, various processes, such as etching, ashing, and film formation, are performed on a target object or semiconductor wafer. Processing apparatuses used for these processes include a process container that can be set to have a vacuum atmosphere, in which a predetermined process is performed on a semiconductor wafer.

Processing apparatuses of this kind include an openable/closable lid disposed on a process container for a maintenance operation to be performed on the interior of the process container. As an opening/closing mechanism for the lid, there is known a type in which a lid is swung about one shaft of a hinge mechanism (for example, Jpn. Pat. Appln. KOKAI Publication No. 11-101345).

Incidentally, along with an increase in the size of semiconductor wafers, processing apparatuses have become larger. Accordingly, there is a process container formed of a plurality of parts, which are separable in the vertical direction. In general, the parts are assembled by use of bolts for fixing, but the bolts may generate dust due to friction of the screw portions. The dust falls inside the process container and exerts an ill effect on semiconductor devices. In light of this, there is a structure in which the parts of a process container are not fixed by use of bolts, and only seal members, such as O-rings, are interposed between the parts. According to this structure, the interior of the process container is vacuum-exhausted after a lid is closed, whereby the interior of the process container is sealed.

In this case, the lid is arranged to be horizontal when the seal members are compressed due to vacuum exhaust. However, along with an increase in the size of the process container, this structure has come to cause the following problem when the lid is being closed before the seal members are compressed. Specifically, when the lid is closed by swinging it about a hinge, a gap is formed between the seal member and lid, and makes it difficult to perform vacuum exhaust as it is.

BRIEF SUMMARY OF THE INVENTION

An object of the present invention is to provide a processing apparatus and a lid opening/closing mechanism used for the apparatus, which can reliably seal an openable/closable lid disposed on a process container.

According to one aspect of the present invention, there is provided a processing apparatus comprising: a process container configured to accommodate a target object; a process mechanism configured to perform a predetermined process on a target object inside the process container; an openable/closable lid disposed on the process container; and an opening/closing mechanism configured to open/close the lid, wherein the opening/closing mechanism includes a hinge structure swingably coupling the lid to one end of the process container, and a drive structure configured to swing the lid, and the hinge structure includes a main shaft used as a rotation axis when the lid is swung by the drive structure, and an adjusting shaft located on a distal end side relative to the main shaft, for adjusting an angle of the lid.

According to another aspect of the present invention, there is provided a lid opening/closing mechanism configured to open/close a lid disposed on a process container of a processing apparatus, in which a predetermined process is performed on a target object accommodated inside the process container, the opening/closing mechanism comprising: a hinge structure swingably coupling the lid to one end of the process container; and a drive structure configured to swing the lid, wherein the hinge structure includes a main shaft used as a rotation axis when the lid is swung by the drive structure, and an adjusting shaft located on a distal end side relative to the main shaft, for adjusting an angle of the lid.

In the present invention, the hinge structure may include a position adjusting mechanism configured to adjustment a position of the lid by rotating the lid about the adjusting shaft used as an axis. The position adjusting mechanism may be configured to adjustment a position of the lid in a vertical direction. The position adjusting mechanism may be configured to adjustment a position of the lid by a screw, configured to adjustment a position of the lid by a spring, or configured to adjustment a position of the lid by an actuator.

The present invention is particularly effective where a seal member is interposed between the lid and the process container, or where the process mechanism is configured to perform a process inside the process container set in a vacuum state.

For example, the process mechanism comprises a microwave generator configured to generate microwaves, an antenna combined with the lid and configured to supply microwaves generated by the microwave generator into the process container, and a process gas supply mechanism configured to supply a process gas into the process container, so as to generate plasma of the process gas by the microwaves inside the process container.

According to the present invention, even in a case where a gap is formed between a lid and a process container by use of swing of the lid about a main shaft alone, the angle of the lid can be adjusted by rotating the lid about an adjusting shaft used as an axis, so as to remove the gap.

BRIEF DESCRIPTION OF THE SEVERAL VIEWS OF THE DRAWING

FIGS. 8A and 8B are views for explaining an opening operation of the lid of the plasma processing apparatus shown in FIG. 1;

FIG. 9 is a schematic view for explaining a disadvantage caused by a conventional opening/closing mechanism; and FIG. 10 is a schematic view for explaining an advantage obtained by an opening/closing mechanism according to this embodiment.

DETAILED DESCRIPTION OF THE INVENTION

An embodiment of the present invention will now be described with reference to the accompanying drawings.

Figure 1:
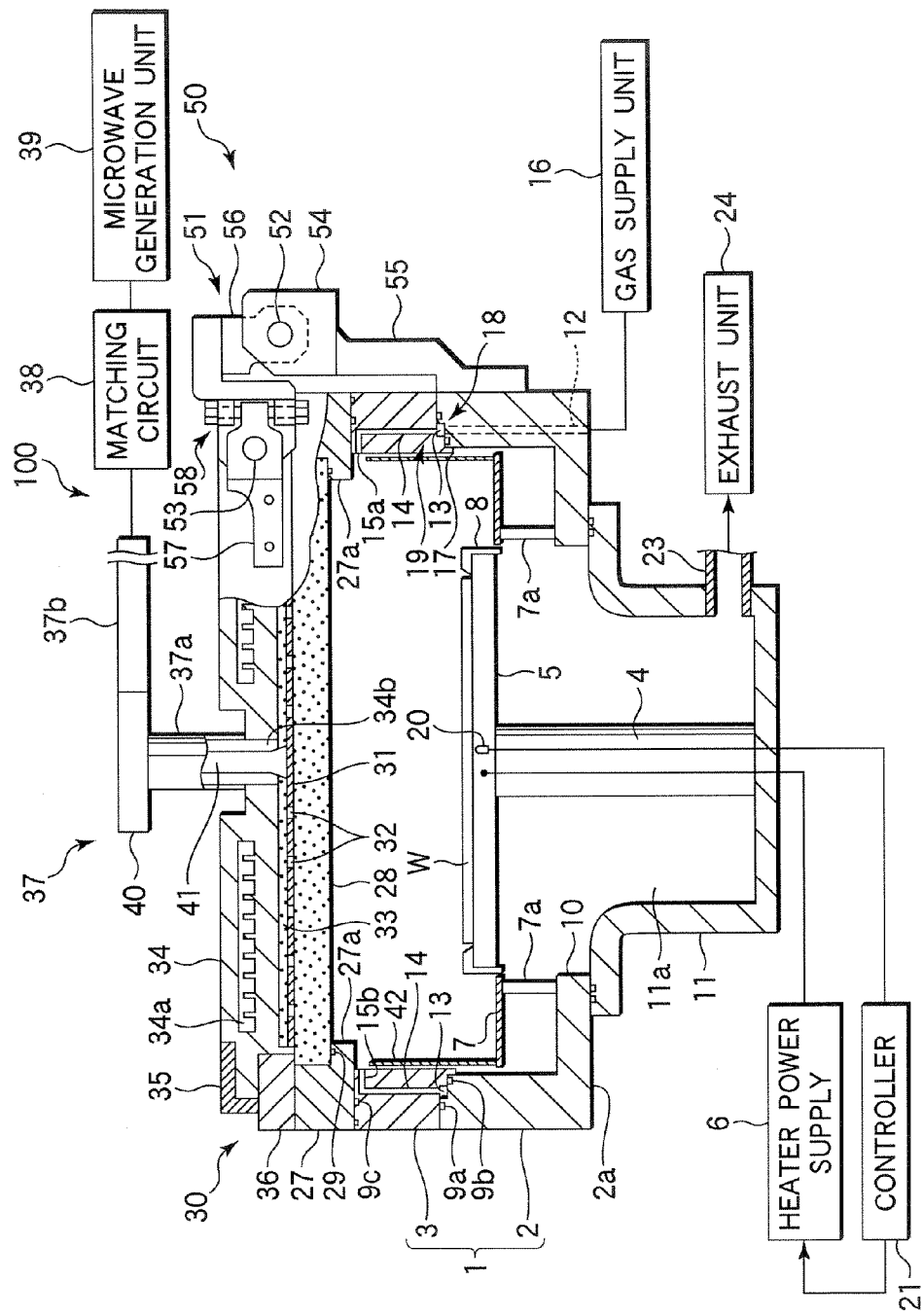
FIG. 1 is a sectional view schematically showing a plasma processing apparatus according to an embodiment of the present invention.

FIG. 1 is a sectional view schematically showing a plasma processing apparatus according to an embodiment of the present invention. This plasma processing apparatus 100 is arranged as a plasma processing apparatus, in which microwaves are supplied from a planar antenna having a plurality of slots, such as an RLSA (Radial Line Slot Antenna), into a process chamber to generate plasma, so that microwave plasma is generated with a high density and a low electron temperature.

The plasma processing apparatus 100 includes an airtight chamber (process container) 1 for accommodating a wafer W, wherein the chamber 1 is formed of an essentially circular cylinder and is grounded. The chamber 1 comprises a housing member (lower chamber) 2 made of a metal, such as aluminum or stainless steel, and forming the lower part of the chamber 1, and a chamber wall (upper chamber) 3 disposed on the housing member 2. The chamber 1 is provided with an openable/closable lid 30, which serves as an antenna portion for supplying microwaves into the process space.

The bottom wall 2a of the housing member 2 has a circular opening portion 10 formed essentially at the center. The bottom wall 2a is provided with an exhaust chamber 11 communicating with the opening portion 10 and extending downward to uniformly exhaust the interior of the chamber 1.

A susceptor 5 is located inside the housing member 2 to support a target substrate, such as a wafer W, in a horizontal state. The susceptor 5 is supported by a cylindrical support member 4 extending upward from the center of the bottom of the exhaust chamber 11. The susceptor 5 and support member 4 may be made of a material selected from quartz and ceramics, such as AlN and $Al_2O_3$. Of these materials, AlN is preferably used, because it has good thermal conductivity. The susceptor 5 is provided with a guide ring 8 located on the outer edge to guide the wafer W. The susceptor 5 is further provided with a heater (not shown) of the resistance heating type built therein. The heater is supplied with a power from a heater power supply 6 to heat the susceptor 5, thereby heating the target object or wafer W. The temperature of the susceptor 5 is measured by a thermo couple 20 embedded in the susceptor 5. A temperature controller 21 is arranged to control the heater power supply 6 on the basis of signals transmitted from the thermo couple 20, so that the temperature can be controlled within a range of from room temperature to 1,000° C.

The susceptor 5 is provided with wafer support pins (not shown) that can project and retreat relative to the surface of the susceptor 5 to support the wafer W and move it up and down. The outer periphery of the susceptor 5 is surrounded by an annular baffle plate 7, which is supported by a plurality of struts 7a. The baffle plate 7 allows the interior of the chamber 1 to be uniformly exhausted. A cylindrical liner 42 made of quartz is attached along the inner wall of the chamber 1 to prevent metal contamination due to the material of the chamber, thereby maintaining a clean environment. The liner 42 may be made of a ceramic (such as $Al_2O_3$, AlN, or $Y_2O_3$).

The sidewall of the exhaust chamber 11 is connected to an exhaust unit 24 including a high speed vacuum pump through an exhaust line 23. The exhaust unit 24 can be operated to uniformly exhaust the gas from inside the chamber 1 into the space 11a of the exhaust chamber 11, and then out of the exhaust chamber 11 through the exhaust line 23. Consequently, the inner pressure of the chamber 1 can be decreased at a high speed to a predetermined vacuum level, such as 0.133 Pa.

The housing member 2 has a transfer port formed in the sidewall and provided with a gate valve for opening/closing the transfer port (they are not shown), so that the wafer W is transferred therethrough.

The sidewall of the chamber 1 has gas feed passages formed therein to supply a process gas into the chamber 1. Specifically, a step portion 18 is formed at the upper end portion of the sidewall of the housing member 2, while a step portion 19 is formed at the lower end portion of the chamber wall 3. As described later, an annular passage 13 is formed between the step portions 18 and 19.

The upper end portion of the chamber wall 3 engages with the lid 30, and the lower end portion of the chamber wall 3 is coupled to the upper end portion of the housing member 2. Gas passages 14 are formed inside the chamber wall 3.

At the upper and lower junctions of the chamber wall 3, seal members 9a, 9b, and 9c, such as O-rings are disposed to ensure that these junctions are airtight. The seal members 9a, 9b, and 9c are made of, e.g., fluorocarbon gum.

The chamber wall 3 has an annular projecting portion 17 formed on the inner side at the lower end, which extends vertically downward like a skirt. The projecting portion 17 covers the boundary (junction) between the chamber wall 3 and housing member 2 to prevent plasma from directly acting on the seal member 9b made of a material that can be easily deteriorated by plasma exposure. Further, the chamber wall 3 has the step portion 19 formed at the lower end, which is combined with the step portion 18 of the housing member 2 to form the annular passage 13.

Gas feed ports 15a are uniformly formed along the inner surface of the chamber wall 3 at a plurality of positions of the upper end, (for example 32 positions). The gas feed ports 15a are connected to feed passages 15b extending therefrom in a horizontal direction. The gas feeding passages 15b are connected to the gas passages 14 extending in the vertical direction in the chamber wall 3.

The gas passages 14 are connected to the annular passage 13, which is formed by the step portions 18 and 19 at the junction between the upper end portion of the housing member 2 and the lower end portion of the chamber wall 3. The annular passage 13 extends in an essentially horizontal annular direction to surround the process spacey. The annular passage 13 is connected to a gas supply unit 16 through passages 12 formed in the housing member 2 at certain positions (for example, at 4 positions uniformly separated) and extending in the vertical direction. The annular passage 13 serves as gas distribution means for supplying a process gas into the gas passages 14 in uniform distribution, thereby preventing the gas from being preferentially supplied into a specific one of the gas feed ports 15a.

As described above, according to this embodiment, a gas from the gas supply unit 16 is supplied through the passages 12, annular passage 13, and gas passages 14, and is uniformly delivered from the gas feed ports 15a at 32 positions into the chamber 1. Consequently, the uniformity of plasma generated within the chamber 1 is improved.

The chamber 1 has an opening portion at the top, which is airtightly closed by a lid 30 serving as an antenna portion. The lid 30 can be opened/closed by an opening/closing mechanism 50 described later.

The lid 30 includes a transmission plate 28, a planar antenna member 31, and a retardation material 33 laminated in this order from the susceptor 5 side. These members are covered with a shield member 34 made of a metal, such as aluminum or stainless steel. These members are airtightly fixed to the support portion of an upper plate 27 through an O-ring by use of an support member 36 and an annular presser ring 35 having an L-shape in a cross section. When the lid 30 is closed, the portion between the upper end portion of the chamber 1 and the upper plate 27 is sealed by the seal member 9c.

The transmission plate 28 is made of a dielectric material, such as quartz, sapphire or a ceramic, e.g., $Al_2O_3$, AlN, or SiN. The transmission plate 28 serves as a microwave introduction window for transmitting microwaves into the process space within the chamber 1. The bottom surface of the transmission plate 28 (on the susceptor 5 side) is not limited to a flat shape, and, for example, a recess or groove may be formed thereon to uniformize microwaves and thereby stabilize plasma. The transmission plate 28 is airtightly supported through a seal member 29 by an annular projecting 27a formed on the inner surface of the upper plate 27 below and around the antenna member 31. Accordingly, when the lid 30 is closed, the interior of the chamber 1 can be kept airtight.

The planar antenna member 31 is formed of a circular plate and is fixed to the inner peripheral surface of the shield member 34 above the transmission plate 28. For example, the planar antenna member 31 is formed of, e.g., a copper plate or aluminum plate with the surface plated with gold or silver. The planar antenna member 31 has a number of slot holes 32 formed therethrough and arrayed in a predetermined pattern, for radiating electromagnetic waves, such as microwaves.

Figure 2:
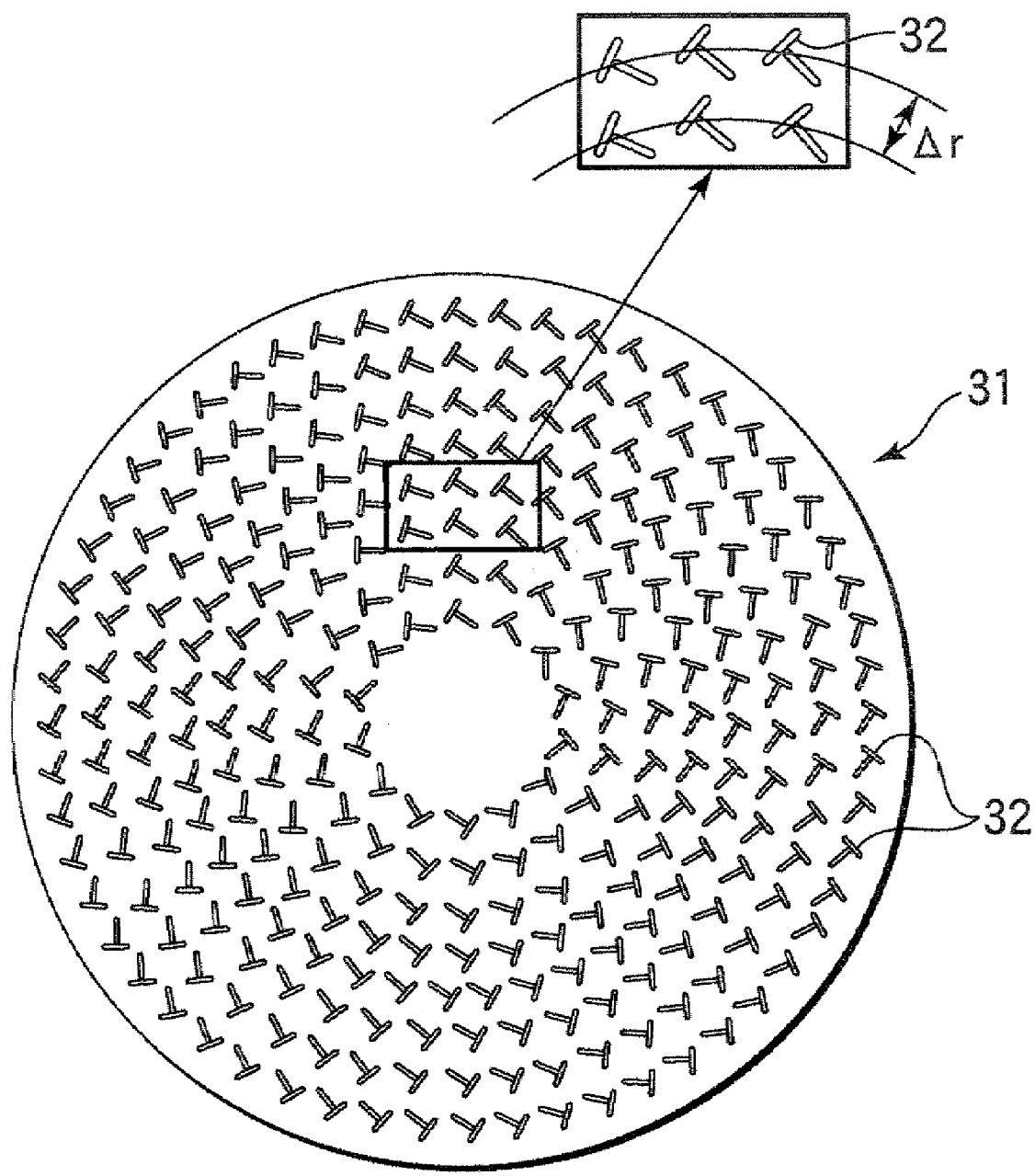
FIG. 2 is a view showing the structure of a planar antenna member used in the plasma processing apparatus.

For example, as shown in FIG. 2, the slot holes 32 are formed of long grooves, wherein the slot holes 32 are typically arranged such that adjacent slot holes 32 form a T-shape, and T-shapes are arrayed on a plurality of concentric circles. The length and array intervals of the slot holes 32 are determined in accordance with the wavelength ($\lambda g$) of microwaves. For example, the intervals of the slot holes 32 are set to be $\frac{1}{4}\lambda g$, $\frac{1}{2}\lambda g$, or $\lambda g$. In FIG. 2, the interval between adjacent slot holes 32 respectively on two concentric circles is expressed with $\Delta r$. The slot holes 32 may have another shape, such as through holes of a circular shape or arc shape. The array pattern of the slot holes 32 is not limited to a specific one, and, for example, it may be spiral or radial other than concentric.

The retardation material 33 has a dielectric constant larger than that of vacuum, and is located on the top of the planar antenna member 31. For example, the retardation material 17 is made of quartz, a ceramic, a fluorine series resin, e.g., polytetrafluoroethylene, or a polyimide resin. The retardation material 33 shortens the wavelength of microwaves to adjust plasma, because the wavelength of microwaves becomes longer in a vacuum condition. The planar antenna member 31 may be set in contact with or separated from the transmission plate 28. Similarly, the retardation material 33 may be set in contact with or separated from the planar antenna member 31.

The shield member 34 is provided with cooling water passages 34a formed therein. Cooling water is supplied to flow through the cooling water passages and thereby cool the shield member 34, retardation material 33, planar antenna member 31, transmission plate 28, and upper plate 27. Consequently, these members are prevented from being deformed or damaged, while plasma is stably generated. The shield member 34 is grounded.

The shield member 34 has an opening portion 34b formed at the center of the upper wall and connected to a wave guide tube 37. The wave guide tube 37 is connected to a microwave generation unit 39 at one end through a matching circuit 38. The microwave generation unit 39 generates microwaves with a frequency of, e.g., 2.45 GHz, which are transmitted through the wave guide tube 37 to the planar antenna member 31. The microwaves may have a frequency of 8.35 GHz or 1.98 GHz.

The wave guide tube 37 includes a coaxial wave guide tube 37a having a circular cross-section and extending upward from the opening portion 34b of the shield member 34, and a rectangular wave guide tube 37b connected to the upper end portion of the coaxial wave guide tube 37a through a mode transducer 40 and extending in a horizontal direction. Microwaves are propagated in a TE mode through the rectangular wave guide tube 37b, and are then transduced into a TEM mode by the mode transducer 40 interposed between the rectangular wave guide tube 37b and coaxial wave guide tube 37a. The coaxial wave guide tube 37a includes an inner conductor 41 extending at the center, which is connected and fixed to the center of the planar antenna member 31 at the lower end. Consequently, microwaves are efficiently propagated from the inner conductor 41 of the coaxial wave guide tube 37a in the radial direction to the planar antenna member 31.

Next, an explanation will be given of the opening/closing mechanism 50 used for the lid 30, with reference to FIGS. 3 to 5. The opening/closing mechanism 50 includes a hinge structure 51 and a drive structure 61.

Figure 3:
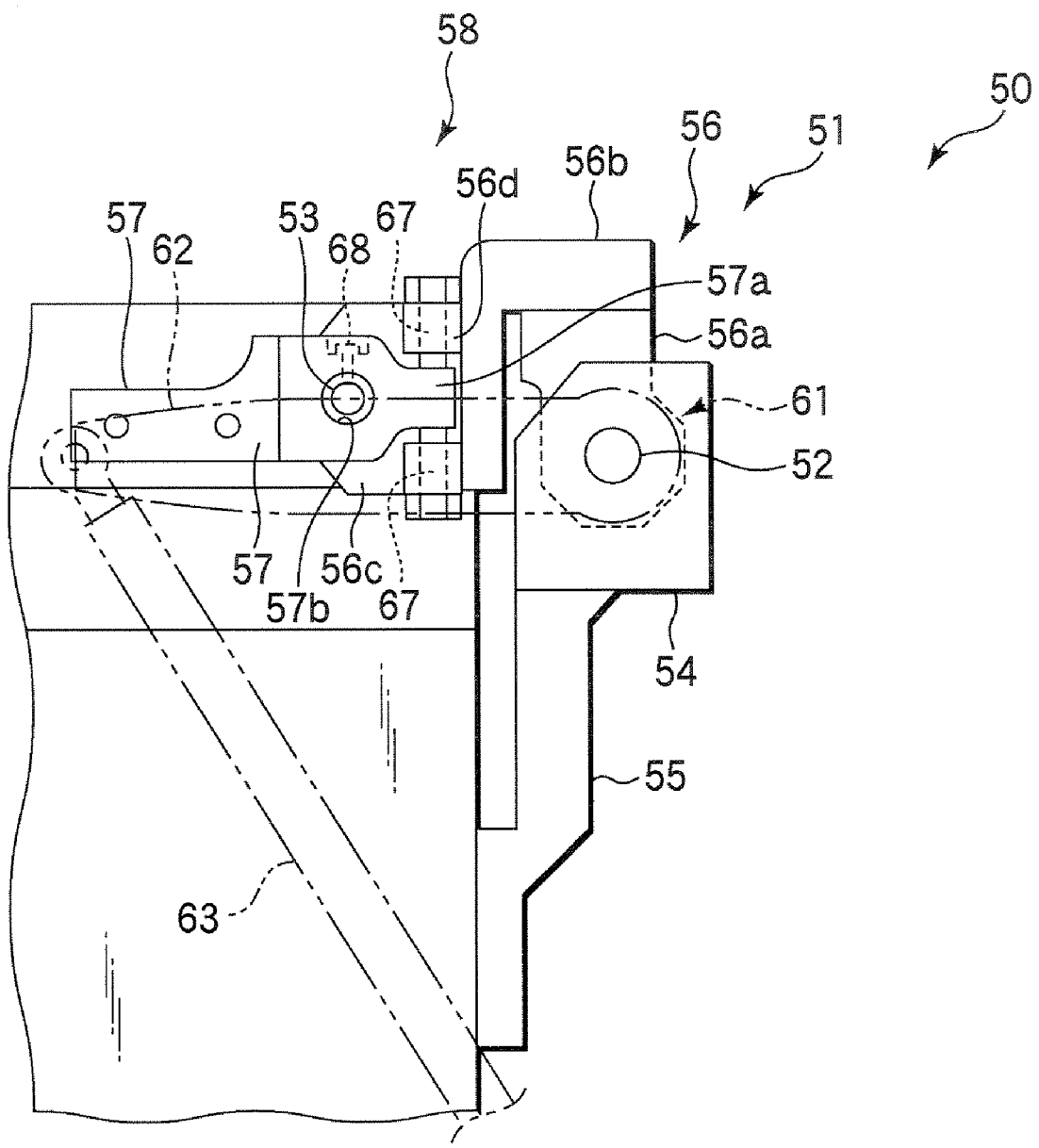
FIG. 3 is an enlarged view showing a hinge structure used in the lid opening/closing mechanism of the plasma processing apparatus shown in FIG. 1.
Figure 4:
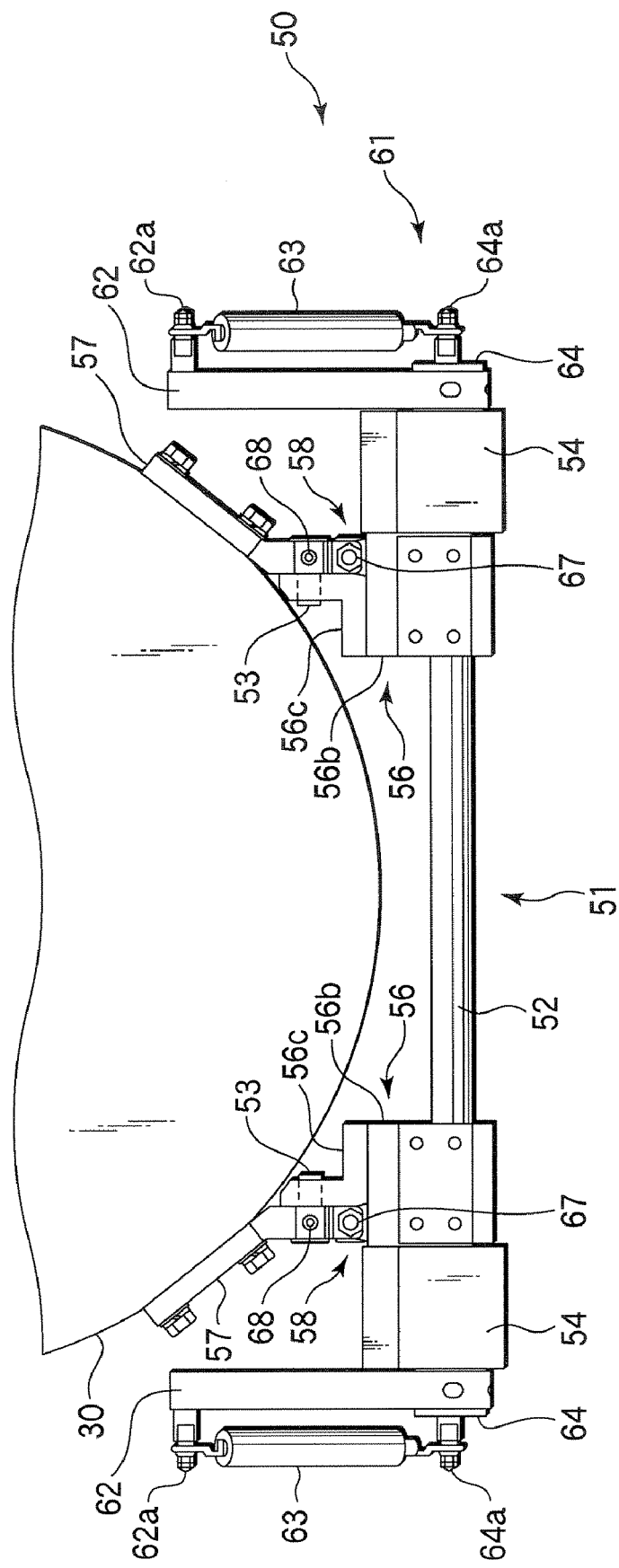
FIG. 4 is a plan view showing the lid opening/closing mechanism of the plasma processing apparatus shown in FIG. 1.

As shown in the enlarged view of FIG. 3 and the plan view of FIG. 4, the hinge structure 51 includes a main shaft 52 serving as a rotation axis for swinging the lid 30, and adjusting shafts 53 located on the distal end side relative to the main shaft 52 and used for adjusting the angle of the lid 30. The main shaft 52 is rotatably supported by support members 54, each of which is mounted on the chamber 1 by a mount member 55. Joint members 56 that rotatably support the adjusting shafts 53 are fixedly connected to the main shaft 52. The lid 30 is coupled to each of the adjusting shafts 53 by a coupling member 57. Position adjusting mechanisms 58 are disposed to adjust the positions of the coupling members 57 and thereby adjust the position of the lid 30. Each of the joint members 56 includes a main shaft fixing portion 56a present on the main shaft 52 side, an adjusting shaft support portion 56c present on the adjusting shafts 53, and an intermediate portion 56b fixed to the main shaft fixing portion 56a and adjusting shaft support portion 56c. The intermediate portion 56b essentially has an L-shape and is fixed to the upper surface of the main shaft fixing portion 56a and the side surface of the adjusting shaft support portion 56c by screws.

Figure 5:
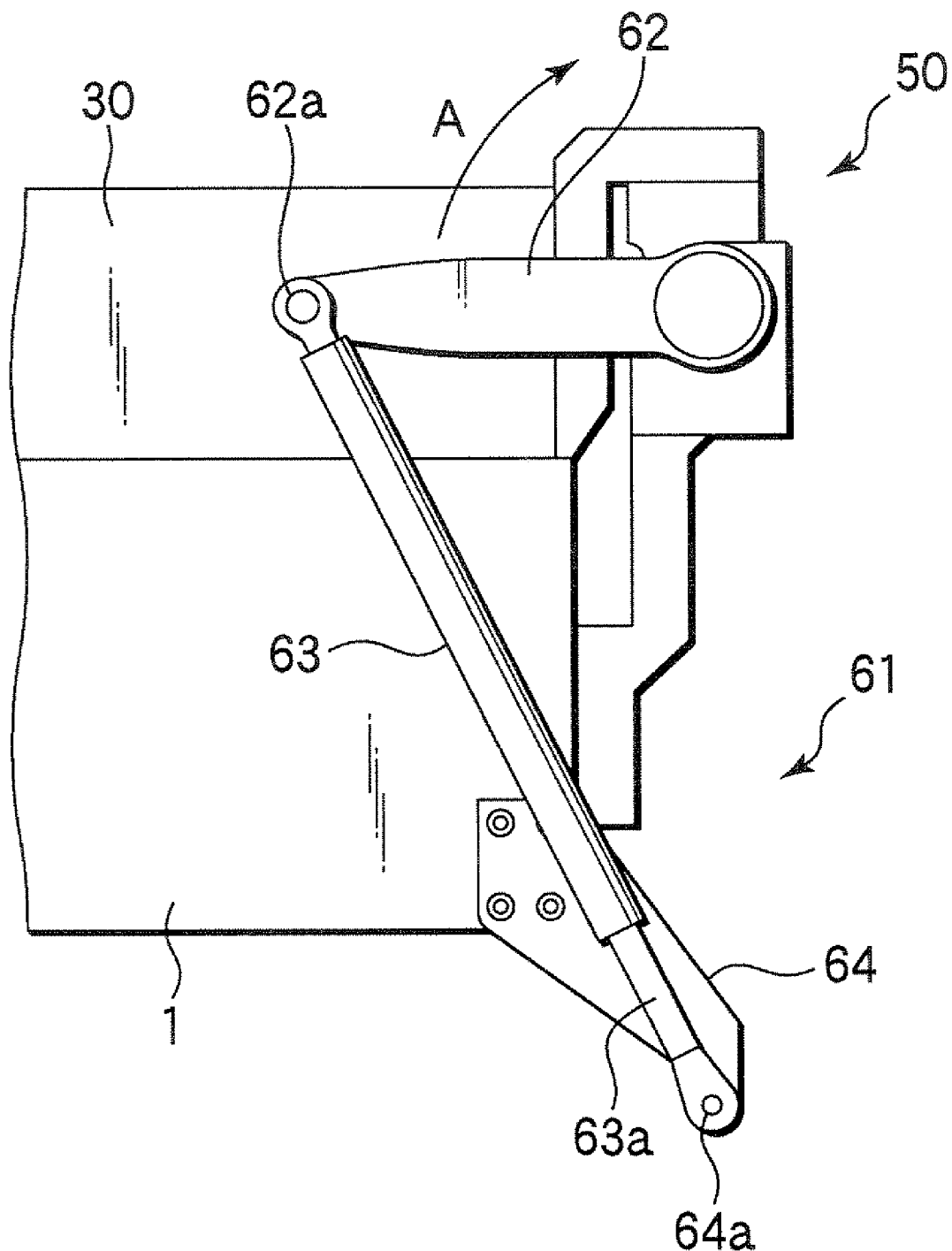
FIG. 5 is a side view showing a drive structure used in the lid opening/closing mechanism of the plasma processing apparatus shown in FIG. 1.

As shown in the plan view of FIG. 4 and the side view of FIG. 5, the drive structure 61 includes a pair of arms 62 attached to the opposite ends of the main shaft 52, and a pair of cylinders 63 connected to the distal end portions of the arms 62. The other end portions of the cylinders 63 are pivotally connected to attachment members 64 fixed to the chamber 1. The arm 62 and attachment member 64 of each set are connected to the corresponding cylinder 63 through the shafts 62a and 64a, respectively, so that they can rotate relative to each other. A shown in FIG. 4, in a state where the lid 30 is closed, the pistons 63a of the cylinders 63 are in the retreated state. When the pistons 63a are moved outward from this state, the arms 62 are swung about the main shaft 52 used as an axis in a direction denoted by an arrow A. At this time, along with rotation of the main shaft 52, the lid 30 is swung upward. The drive mechanism of the drive structure 61 is not limited to a cylinder, but may be another type.

As shown in FIG. 3, each of the position adjusting mechanisms 58 includes a pair of adjusting screws 67 disposed to sandwich the upper and lower surfaces of the corresponding projecting portion 57a extending outward relative to the adjusting shaft 53 of the coupling member 57. By adjusting the adjusting screws 67, the angle of the lid 30 relative to the corresponding adjusting shaft 53 can be fine-adjusted. The adjusting screws 67 are respectively attached to a pair of screw attaching portions 56d projecting from the adjusting shaft support portion 56c of the joint member 56 to positions above and below the projecting portion 57a. Each of the adjusting shafts 53 is inserted with some clearance into insertion hole 57b formed in the coupling members 57, so that position adjustment between the adjusting shaft 53 and coupling member 57 can be performed by a positioning screw 68. With this arrangement, the position of the lid 30 in the height direction can also be fine-adjusted by the adjusting screws 67 and positioning screw 68. In place of the positioning screw 68, a fixing screw may be used.

Figure 6A:
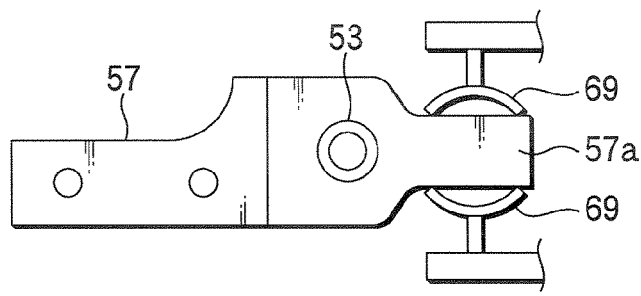
FIGS. 6A to 6C are enlarged views showing a case where a spring is used as a position adjuster in the hinge structure of the lid opening/closing mechanism of the plasma processing apparatus shown in FIG. 1.
Figure 6B:
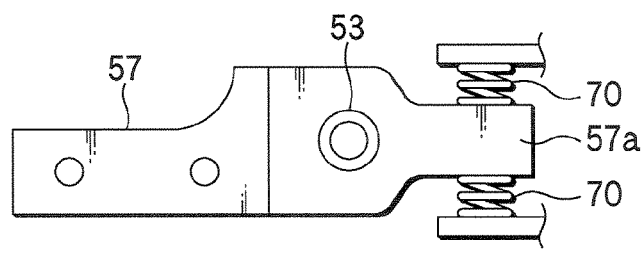
Figure 6C:
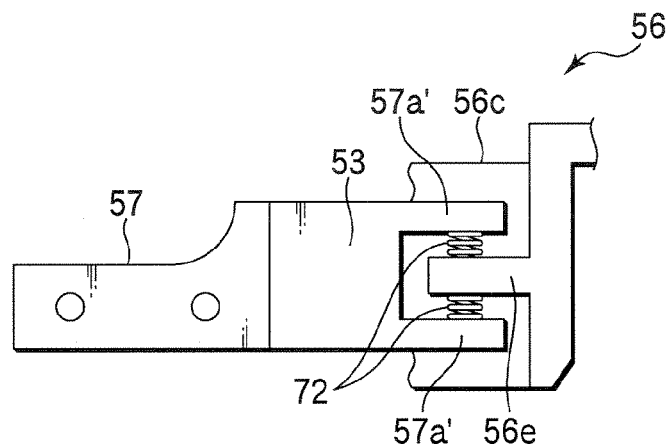
Figure 7:
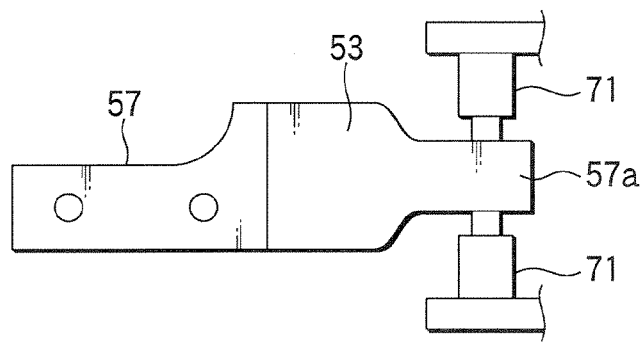
FIG. 7 is an enlarged view showing a case where an actuator is used as a position adjuster in the hinge structure of the lid opening/closing mechanism of the plasma processing apparatus shown in FIG. 1.

The position adjusting mechanism 58 may include, in place of the adjusting screws 67, a pair of conical springs 69 shown in FIG. 6A, or a pair of resilient members, such as coil springs 70, shown in FIG. 6B, to automatically perform position adjustment. Alternatively, as shown in FIG. 6C, it may be arranged such that two projecting portions 57a' are formed to project from the coupling members 57, while a projecting portion 56e is formed on the joint member 56, so that the projecting portion 56e is located between the two projecting portions 57a'. In this case, resilient members, such as coil springs 72, are interposed between the projecting portion 56e and projecting portions 57a' to automatically perform position adjustment. Alternatively, as shown in FIG. 7, it may be arranged such that actuators 71, such as air cylinders, are disposed on the opposite sides of the projecting portion 57a to perform adjustment.

Next, an explanation will be given of an operation of the plasma processing apparatus 100 having the structure described above.

At first, the plasma processing apparatus 100 is set in the sealed state with the lid 30 closed. In this state, a wafer W is loaded into the chamber 1 and placed on the susceptor 5. Then, process gases are supplied at predetermined flow rates from the gas supply unit 16 through the gas feed ports 15a into the chamber 1. Examples of the process gases are a rare gas, such as Ar, Kr, or He, and an oxide gas such as $O_2$, $N_2O$, NO, $NO_2$, or $CO_2$, or a nitride gas such as $N_2$ or $NH_3$. The process gases may be formed of other film formation gases or etching gases.

Then, microwaves are supplied from the microwave generation unit 39 through the matching circuit 38 into the wave guide tube 37. The microwaves are guided through the rectangular wave guide tube 37b, mode transducer 40, and coaxial wave guide tube 37a in this order, and are then propagated through the inner conductor 41 to the planar antenna member 31. Then, the microwaves are radiated from the slots of the planar antenna member 31 through the transmission plate 28 into the chamber 1.

The microwaves are propagated in a TE mode through the rectangular wave guide tube 37b, and are then transduced from the TE mode into a TEM mode by the mode transducer 40 and propagated in the TEM mode through the coaxial wave guide tube 37a to the planar antenna member 31. When the microwaves are radiated from the planar antenna member 31 through the transmission plate 28 into the chamber 1, an electromagnetic field is thereby formed inside the chamber 1 and plasma of the process gases is generated.

Since microwaves are radiated from a number of slot holes 32 of the planar antenna member 31, the plasma has a high plasma density of about $1\times10^{10}$ to $5\times10^{12}/cm^3$ or more and a low electron temperature of about 1.5 eV or less. Accordingly, where this plasma acts on the wafer W, the process can be performed while suppressing plasma damage.

When a maintenance operation is performed on this plasma processing apparatus 100, the lid 30 serving as an antenna portion is opened. For this purpose, the pistons 63a of the cylinders 63 are moved outward in the drive structure 61 of the opening/closing mechanism 50, so that the arms 62 are swung in a direction denoted by an arrow A. Consequently, the lid 30 is swung about the main shaft 52 used as a rotation axis in the direction denoted by the arrow A. As shown in FIG. 8A, where the pistons 63a of the cylinders 63 are moved outward at the maximum, the lid 30 is opened by an angle of 90 degrees. Then, as shown in FIG. 8B, where the pistons 63a are moved inward or returned from this state, the lid 30 is further opened by an angle of 180 degrees.

When the maintenance operation is finished, the lid 30 is closed. For this purpose, the cylinders 63 are controlled so that the lid 30 is swung in the opposite direction from the state shown in FIG. 8B. In the chamber 1 at this time, the seal members 9a and 9b interposed between the housing member 2 and chamber wall 3 and the seal member 9c disposed on the chamber wall 3 are in an uncompressed state. Accordingly, when the lid 30 is swung about the main shaft 52 used as a rotation axis to close the lid 30, a gap can be formed between the lid 30 and chamber 1 at the distal end portion of the lid 30 (on the side opposite to the rotary shaft).

This problem will be explained in detail with reference to the schematic view of FIG. 9.

In general, the lid 30 is designed to be horizontal when the seal members are compressed. Accordingly, when the lid 30 is being closed before the seal members are compressed, the position of the upper surface of the chamber 1 is higher than the position P thereof (indicated by an broken line in FIG. 9) obtained after the seal members are compressed. In this case, if the lid 30 is simply swung about the main shaft 52, the proximal end of the lid 30 reaches the upper surface of the chamber 1 before the distal end portion of the lid 30 reaches the upper surface of the chamber 1. Consequently, a gap S is formed at the distal end portion of the lid 30 and inhibits sealing; which makes it difficult to perform vacuum exhaust as it is.

In this respect, according to this embodiment, the problem described above is solved by the following arrangement. Specifically, the hinge structure 51 is provided with the adjusting shafts 53, so that the adjusting shafts 53 can be used as rotation axes to adjust the angle of the lid 30 by the position adjusting mechanisms 58. In other words, as shown in FIG. 10, when the seal members are in an uncompressed state, the angle of the lid 30 is adjusted to set the lid 30 in a horizontal state. Consequently, the chamber 1 is reliably sealed; which makes it possible to perform vacuum exhaust as it is. Further, there may be a case where the use of the angle adjustment alone is insufficient to adjust the position of the lid 30. In this case, according to the position adjusting mechanisms 58, the position of the lid 30 can be suitably adjusted by vertical position adjustment of the lid 30 in addition to the angle adjustment.

The present invention is not limited to the embodiment described above, and it may be modified in various manners. For example, in the embodiment described above, the plasma processing apparatus is exemplified by the RLSA type, but the plasma processing apparatus may be of another type, such as the remote plasma type, ICP type, ECR type, surface reflection wave type, or magnetron type. The type of the plasma process is not limited to a specific one, and it may be selected from various plasma processes, such as oxidation process, nitridation process, oxynitridation process, film formation process, and etching process. Further, the present invention is not limited to plasma processes, and it may be applied to another process in which a predetermined process is performed in a chamber of a vacuum processing apparatus. However, the present invention is not limited to vacuum processes. Furthermore, the target object is not limited to a semiconductor wafer, and it may be another substrate, such as a glass substrate for FPDs or a compound semiconductor substrate.

What is claimed is:

1. A plasma processing apparatus comprising:
   a process container configured to accommodate a target object;
   a plasma process mechanism configured to perform a predetermined process under vacuum on a target object inside the process container;
   an openable/closable lid disposed on the process container; and
   an opening/closing mechanism configured to open/close the lid,
   wherein the opening/closing mechanism includes a hinge structure swingably coupling the lid to one end of the process container, and a drive structure configured to swing the lid, such that the hinge structure includes,
   a support member attached to the process container,
   a main shaft rotatably supported by the support member and configured to be driven by the drive structure and to serve as a rotation axis of the lid, a joint member fixed to the main shaft,
   an adjusting shaft rotatably supported by the joint member and configured to serve as an axis for adjusting an angle of the lid relative to the joint member,
   a coupling member fitted on the adjusting shaft and attached to the lid, and
   a position adjusting device configured to adjust a position of the coupling member relative to the adjusting shaft,
   wherein the position adjusting device comprises a positioning screw disposed between the adjusting shaft and the coupling member and configured to set a position of the coupling member relative to the adjusting shaft,
   a projecting portion integratedly disposed on the coupling member and extending toward the joint member from a side of the coupling member opposite to the lid, and
   an adjusting member disposed between the joint member and the projecting portion and configured to set a position of the projecting portion relative to the joint member and thereby to contribute to positioning of the coupling member.

2. The processing apparatus according to claim 1, wherein the adjusting member is configured to adjust and fix a position of the projecting portion in a vertical direction.

3. The processing apparatus according to claim 2, wherein the adjusting member comprises a screw.

4. The processing apparatus according to claim 1, wherein the adjusting member comprises a spring.

5. The processing apparatus according to claim 1, wherein the adjusting member comprises an actuator.

6. The processing apparatus according to claim 1, wherein a seal member is interposed between the lid and the process container.

7. The processing apparatus according to claim 1, wherein the process mechanism comprises a microwave generator configured to generate microwaves, an antenna combined with the lid and configured to supply microwaves generated by the microwave generator into the process container, and a process gas supply mechanism configured to supply a process gas into the process container, so as to generate plasma of the process gas by the microwaves inside the process container.

8. The processing apparatus according to claim 1, wherein the adjusting member comprises an upper positioning element and a lower positioning element with the projecting portion interposed therebetween.

9. The processing apparatus according to claim 1, wherein the projecting portion comprises an upper projecting portion and a lower projecting portion, the joint member comprises an extending portion present between the upper projecting portion and the lower projecting portion, and the adjusting member comprises an upper positioning element disposed between the upper projecting portion and the extending portion and a lower positioning element disposed between the lower projecting portion and the extending portion.

10. A lid opening/closing mechanism configured to open/close a lid disposed on a process container of a plasma processing apparatus, in which a predetermined process is performed under vacuum on a target object accommodated inside the process container, the opening/closing mechanism comprising:
    a hinge structure swingably coupling the lid to one end of the process container; and
    a drive structure configured to swing the lid,
    wherein the hinge structure includes,
    a support member attached to the process container,
    a main shaft rotatably supported by the support member and configured to be driven by the drive structure and to serve as a rotation axis of the lid,
    a joint member fixed to the main shaft,
    an adjusting shaft rotatably supported by the joint member and configured to serve as an axis for adjusting an angle of the lid relative to the joint member, and
    a coupling member fitted on the adjusting shaft and attached to the lid,
    a position adjusting device configured to adjust a position of the coupling member relative to the adjusting shaft,
    wherein the position adjusting device comprises a positioning screw disposed between the adjusting shaft and the coupling member and configured to set a position of the coupling member relative to the adjusting shaft,
    a projecting portion integratedly disposed on the coupling member and extending toward the joint member from a side of the coupling member opposite to the lid, and
    an adjusting member disposed between the joint member and the projecting portion and configured to set a position of the projecting portion relative to the joint member and thereby to contribute to positioning of the coupling member.

11. The opening/closing mechanism according to claim 10, wherein the adjusting member is configured to adjust and fix a position of the projecting portion in a vertical direction.

12. The opening/closing mechanism according to claim 11, wherein the adjusting member comprises a screw.

13. The opening/closing mechanism according to claim 10, wherein the adjusting member comprises a spring.

14. The opening/closing mechanism according to claim 10, wherein the adjusting member comprises an actuator.

15. The opening/closing mechanism according to claim 10, wherein the adjusting member comprises an upper positioning element and a lower positioning element with the projecting portion interposed therebetween.

16. The opening/closing mechanism according to claim 10, wherein the projecting portion comprises an upper projecting portion and a lower projecting portion, the joint member comprises an extending portion present between the upper projecting portion and the lower projecting portion, and the adjusting member comprises an upper positioning element disposed between the upper projecting portion and the extending portion and a lower positioning element disposed between the lower projecting portion and the extending portion.

* * * * *